(12) United States Patent
Wang et al.

(10) Patent No.: US 8,692,197 B2
(45) Date of Patent: Apr. 8, 2014

(54) SCANNING ELECTRON MICROSCOPE OPTICAL CONDITION SETTING METHOD AND SCANNING ELECTRON MICROSCOPE

(75) Inventors: Zhigang Wang, Hitachinaka (JP); Nobuhiro Okai, Kokubunji (JP); Ritsuo Fukaya, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/578,179

(22) PCT Filed: Feb. 9, 2011

(86) PCT No.: PCT/JP2011/000704
§ 371 (c)(1),
(2), (4) Date: Aug. 9, 2012

(87) PCT Pub. No.: WO2011/105015
PCT Pub. Date: Sep. 1, 2011

(65) Prior Publication Data
US 2012/0318977 A1 Dec. 20, 2012

(30) Foreign Application Priority Data
Feb. 26, 2010 (JP) ................................. 2010-041238

(51) Int. Cl.
*H01J 37/26* (2006.01)
(52) U.S. Cl.
USPC ...... 250/311; 250/307; 250/310; 250/440.11; 250/492.1; 250/492.2
(58) Field of Classification Search
USPC ......... 250/306, 307, 310, 311, 440.11, 492.1, 250/492.2, 492.3
See application file for complete search history.

(56) References Cited

U.S. PATENT DOCUMENTS

| | | | | |
|---|---|---|---|---|
| 6,521,891 B1* | 2/2003 | Dotan et al. | ................. | 250/310 |
| 6,931,620 B2* | 8/2005 | Nishiyama et al. | ........... | 250/310 |
| 6,946,656 B2* | 9/2005 | Ezumi et al. | .................... | 850/11 |
| 2007/0221845 A1* | 9/2007 | Komuro et al. | ............... | 250/310 |
| 2008/0017797 A1* | 1/2008 | Cheng et al. | .................. | 250/310 |
| 2008/0056746 A1* | 3/2008 | Suhara | ............................ | 399/56 |

(Continued)

FOREIGN PATENT DOCUMENTS

| JP | 4-229541 A | 8/1992 |
|---|---|---|
| JP | 2001-236915 A | 8/2001 |

(Continued)

OTHER PUBLICATIONS

International Search Report dated May 31, 2011 (three (3) pages).

*Primary Examiner* — Michael Logie
(74) *Attorney, Agent, or Firm* — Crowell & Moring LLP

(57) ABSTRACT

A scanning electron microscope and an optical-condition setting method are provided. The optical condition allows the suppression of a lowering in the measurement and inspection accuracy caused by the influence of electrification, even if there are a large number of measurement and inspection points. A pattern on a sample is measured based on the detection of electrons by scanning the sample surface with an electron beam. A change in measurement values relative to the number of measurements is determined from the measurement values at a plurality of measurement points on the sample, and the sample-surface electric field is controlled so that the inclination of the change becomes equal to zero, or becomes close to zero.

4 Claims, 7 Drawing Sheets

(56) References Cited

U.S. PATENT DOCUMENTS

2008/0073528 A1* 3/2008 Sasaki et al. .................. 250/307
2008/0203298 A1* 8/2008 Ishijima et al. ............... 250/307
2009/0166557 A1* 7/2009 Makino et al. ........... 250/442.11
2009/0224749 A1* 9/2009 Tsunoda et al. ................ 324/96

FOREIGN PATENT DOCUMENTS

| JP | 2005-345272 A | | 12/2005 | |
| JP | 2005345272 A | * | 12/2005 | ............ G01B 15/00 |
| JP | 2008-218014 A | | 9/2008 | |
| WO | WO 03/007330 A1 | | 1/2003 | |

* cited by examiner $$Q = \int_0^{T_0} \left( i_{\text{PRIMARY ELECTRONS}} - i_{\text{SECONDARY ELECTRONS + REFLECTED ELECTRONS}} + i_{\text{RE-ENTER ELECTRONS}} \right) dt$$

SCANNING ELECTRON MICROSCOPE OPTICAL CONDITION SETTING METHOD AND SCANNING ELECTRON MICROSCOPE

TECHNICAL FIELD

The present invention relates to an optical-condition setting method for a scanning electron microscope, and the scanning electron microscope. In particular, it relates to a method and device for allowing the optical condition to be properly set even in the case of a sample which becomes electrified.

BACKGROUND ART

As sample-surface analysis devices, there exist the following analysis devices: Namely, these devices analyze the sample characteristics by scanning the sample surface with a charged-particle beam probe, and analyzing the amount of emitted signals such as secondary electrons, ions, and electromagnetic waves. This kind of sample-surface analysis devices exhibit an advantage of being capable of easily acquiring information about such factors as the surface's ultra-fine profile and constitution elements. In particular, a scanning electron microscope (: SEM) has come into practical use widely. Here, the scanning electron microscope acquires the surface-profile image by using electrons as the probe, and the secondary electrons as the emitted signal, and by converting the secondary-electron amount into the luminance on the screen. Also, as semiconductor-element inspection devices, inspection devices such as a CD-SEM (: Critical Dimension-SEM) and an inspection SEM have been in wide use in semiconductor fabrication industries. Here, the CD-SEM is a dimension inspection device derived from the scanning electron microscope, and the inspection SEM is a profile inspection device.

A charged-particle beam device, the representative of which is the scanning electron microscope, is a device for irradiating a sample with the beam that is equipped with the electric charge. Accordingly, there exists a possibility that the sample becomes electrified. Consequently, there exists the following possibility: Namely, the electrification, which adhere to the sample, exert an influence on the charged-particle beam, thereby changing the optical condition on the charged-particle beam. The existence of this possibility gives rise to the requirements for accurate detection of the electrification and proper optical-condition adjustment.

In PATENT LITERATURE 1, the explanation has been given concerning the following technique: Namely, large-area electrification, which are accumulated over the entire sample, are measured in such a manner that the measurement on the surface potential using an energy filter is performed at a plurality of measurement points. In PATENT LITERATURE 2 as well, the proposal has been made regarding the following technique: Namely, the electrification amount is determined by the electrification measurement method using the energy filter, or is determined by making the calculation in response to a set magnification.

In PATENT LITERATURE 3, the explanation has been given concerning the following charge-up prevention method for the charged-particle beam device: Namely, in this prevention technique, the voltage to be applied to the sample (i.e., target) is changed. Moreover, a location existing on the insulating-property target and having a linear-line portion is scanned with the electron beam for each of the change. Furthermore, of peaks of a signal obtained by differentiating the secondary-electron signal generated by the scan, the largest peak value is generated at a point-in-time. Then, the applied-voltage value at this point-in-time is applied to the target. In this way, the charge-up of the insulating-property target is eliminated. Also, in PATENT LITERATURE 4 as well, similarly, the explanation has been given regarding the following technique: Namely, a focus shift, which is caused to occur by the electrification accumulated on the sample, is compensated for by analyzing a plurality of scores that are obtained by changing the beam energy.

CITATION LIST

Patent Literature

PATENT LITERATURE 1: JP-A-2008-218014 (corresponding to US2008/0203298)
PATENT LITERATURE 2: WO2003/007330 (corresponding to U.S. Pat. No. 6,946,656)
PATENT LITERATURE 3: JP-A-4-229541
PATENT LITERATURE 4: JP-A-2001-236915 (corresponding to U.S. Pat. No. 6,521,891)

SUMMARY OF INVENTION

Technical Problem

In recent years, the number of inspection and measurement points by the scanning electron microscope (SEM) used for semiconductor inspections and measurements follow a course of the increase. For example, in a photomask used for the transfer of a semiconductor pattern or flat panel, in accompaniment with the ultra-fine miniaturization of the pattern or the like, it is becoming increasingly difficult to form the resist pattern that is faithful to design data. This difficulty is caused to occur by the influence of the optical proximity effect (OPC). A trial of implementing a proper pattern formation by adding a supplemental pattern (i.e., OPC pattern) is performed in order to solve a problem like this. In accompaniment with the high-integration implementation and ultra-fine miniaturization of a semiconductor element, an OPC pattern like this becomes complicated. As a result, there also exists the increasing tendency about the number of the inspection and measurement points by the scanning electron microscope.

Meanwhile, in accompaniment with the increase in the number of the measurement points, it has come to recognize a phenomenon that the electrification are cumulatively accumulated on the sample. If the number of the electrons entering the sample is not equal to the number of the electrons emitted from the sample, the sample becomes positively or negatively electrified. In particular, when, as described above, the large number of measurement points exist on the sample, the individual electric charges are accumulated thereon. These accumulated electric charges, eventually, change the electric potential on the sample surface.

According to the energy-filter-based electrification measurement methods as are explained in PATENT LITERATURE 1 and PATENT LITERATURE 2, it is possible to accurately measure the electrification of the field-of-view (FOV) of the scanning electron microscope. No mention, however, has been made regarding the cumulatively-accumulated electrification as are described above. Also, in the techniques as are explained in PATENT LITERATURE 3 and PATENT LITERATURE 4, the applied voltage to the sample is adjusted so that the electrification adhering to the sample are cancelled out thereby. In these techniques, however, the optical condition is required to be adjusted so that the optical condition follows the gradually-accumulated electrification in compliance therewith. The requirement of this adjustment results in a lowering in the throughput at the multi-points measurement time. Simultaneously, this requirement makes it impossible to address the magnification variation or the like.

Hereinafter, the explanation will be given below concerning an optical-condition setting method for a charged-particle beam device, and the charged-particle beam device whose object is to set the following optical condition: Namely, an optical condition which allows the suppression of a lowering in the measurement and inspection accuracy caused by the influence of electrification, even if there exist a large number of measurement and inspection points.

Solution to Problem

As an aspect for accomplishing the above-described object, the following scanning electron microscope or optical-condition setting method is proposed: Namely, a scanning electron microscope or an optical-condition setting method for measuring a pattern on a sample based on the detection of electrons, the electrons being emitted from the sample by scanning the sample surface with an electron beam, wherein a change in measurement values relative to the number of measurements is determined from the measurement values at a plurality of measurement points on the sample, and the sample-surface electric field is controlled so that the inclination of the change becomes equal to zero, or becomes close to zero.

Advantageous Effects of Invention

According to the above-described configuration, it becomes possible to suppress the influence of the cumulatively-accumulated electrification caused by the electron-beam irradiation over the plurality of measurement and inspection points existing on the sample. As a result, it becomes possible to implement the high-accuracy measurement and inspection.

DESCRIPTION OF EMBODIMENTS

Figure 2:
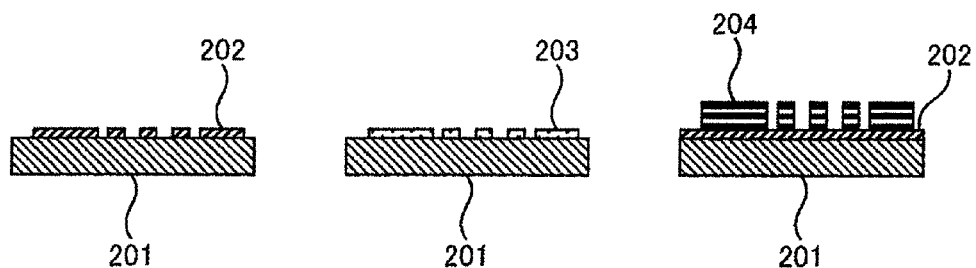
FIG. 2 is a diagram for explaining the cross-section of a photomask.

The mainstream technology for forming a circuit pattern on a wafer is as follows: Namely, a circuit pattern composed of a non-transparent film is formed on a transparent substrate which is referred to as "photomask". Moreover, the circuit pattern is transferred onto the wafer, using an optical tool such as short-wavelength (i.e., about 200-nm wavelength) ultraviolet laser light. The dimension measurement on the circuit pattern formed on the photomask is also an important quality management step. As illustrated in FIG. 2, the photomask is fabricated as follows: Namely, the circuit pattern is formed on a substrate 201, using a low-ultraviolet-area-transmission-ratio material such as chromium 202 or molybdenum silicon oxide (MoSiO) 203. Here, the substrate 201 is composed of a high-ultraviolet-area-transmission-ratio material such as synthesized quarts glass.

Also, in the photomask fabrication processes, in some cases, a photoresist 204 exists on the chromium 202 or the molybdenum.silicon oxide (MoSiO) 203. When a photomask like this is observed using a scanning electron microscope, in some cases, the electrification is formed on the sample surface. As described earlier, the mainstream material for the substrate 201 of the photomask is the quarts glass, which is a dielectric material. As a result, in the scanning electron microscope, the sample surface is caused to become electrified by the effect of a primary-electron beam with which the surface is irradiated. Also, applying an electric field to the sample from the outside causes the sample to be easily polarized, thereby giving rise to the generation of an electric potential. In some cases, the local electric field caused by the generated electric charges exerts an influence on the orbit of the primary-electron beam, thereby exerting such influences as distortion of an observed image, displacement of the image, and a change in the magnification.

Up to the present, the following trial has been performed in order to relax the influence exerted onto the sample: Namely, the incident energy (i.e., acceleration voltage) of the primary-electron beam is lowered to reduce the resultant electron-beam current (i.e., probe current). If, however, almost entire volume of the sample is composed of a dielectric material like the photomask, it is difficult to sufficiently suppress the influence of the electrification as described above. Also, the following technology has come into practical use: Namely, inactive-gas molecules are caused to exist at a proper partial pressure within a space in proximity to the sample surface to be observed. Moreover, the electric charges on the substrate surface are actively eliminated by the inactive-gas molecules that are weakly ionized by the effect of the primary-electron beam. In this case, however, there exists a problem that the inactive-gas molecules scatter the secondary electrons thereby to deteriorate the image signal. Accordingly, this technology has not fully prevailed in semiconductor fabrication industries. Furthermore, the following technology has also been proposed: Namely, the sample is irradiated with charged particles which are generated in an independent and separate manner. In this case, however, it is difficult to appropriately determine an electrification-neutralizing point of the sample electrification. Consequently, this technology has not come into practical use.

Figure 3:
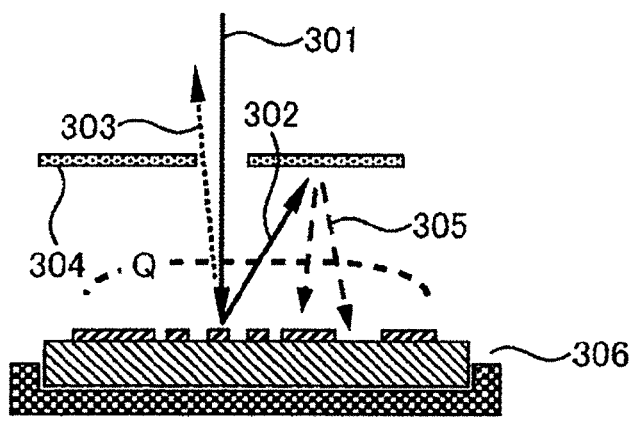
FIG. 3 is a diagram for explaining the principle of the sample electrification caused to occur by the electron-beam irradiation.

In view of this situation, in the present embodiment, the investigation has been made concerning the process of the accumulation of the electrification onto the sample. FIG. 3 illustrates a phenomenon which will occur when the sample is irradiated with the primary-electron beam. The primary-electron beam 301 that has entered the sample surface, in a process where the primary-electron beam is scattered inside the sample-constituting substances, is reflected in the incident direction by the so-called Rutherford scattering (i.e., backscattered electrons 302). Otherwise, the primary-electron beam 301 hammers out in-core electrons out of the atoms, thereby generating secondary electrons 303. The generation efficiency of the secondary electrons (i.e., a rate of generated secondary electrons in average per a single primary electron) is determined by the composition of the substances, and is a function of the kinetic energy of the primary electrons. In general, in the energy area used by the scanning electron microscope, the generation efficiency (i.e., amount of electrons emitted from a sample/amount of electrons entered into the sample) exceeds 1.0. As a result, the sample becomes positively electrified gradually. In some cases, however, some of the primary electrons reflected in the backward direction enter proximate objects such as a counter plate 304, thereby generating secondary electrons 305 once again.

The secondary electrons 305 re-enter the sample in accompaniment with a-few-electron-volts (eV) energy, thereby making a contribution to the sample electrification. Namely, the amount of the electric charges accumulated onto the sample within a unit time is given by the following relationship Expression (1) (for convenience, the polarity of a current based on the primary-electron beam is represented as being positive):

[Expression 1]

$$Q = \int_0^{T_0} (i_{primary\ electrons} - i_{secondary\ electrons + reflected\ electrons} + i_{re-enter\ electrons}) dt \quad (1)$$

Q: electric charges accumulated;

$T_0$: irradiation time of primary-electron beam;

$i_{primary\ electrons}$: flow-in current based on primary-electron beam;

$i_{secondary\ electrons + reflected\ electrons}$: flow-out current based on secondary electrons and reflected electrons;

$i_{re-enter\ electrons}$: flow-in current based on re-enter of secondary electrons generated by reflected electrons;

Now, consideration is given to an operation of making Q as small as possible. This operation means that the integrand in the Expression (1) becomes close to 0, namely, the three currents appearing in the Expression (1) fall into a state of equilibrium. In order to Q small, it is desirable that the above-described three currents are in the state of equilibrium from immediately after the irradiation start of the primary-electron beam.

The current $i_{primary\ electrons}$ is set by the optimization of image-observing conditions together with the incident energy of the primary-electron beam. The current $i_{secondary\ electrons + reflected\ electrons}$, which is a function of the sample-constituting substances and the incident energy of the primary-electron beam, can be adjusted by the optimization of the incident energy.

The incident energy is determined by a voltage (i.e., retarding electric potential) which is to be applied to a holder 306 illustrated in FIG. 3. Meanwhile, the current $i_{re-enter\ electrons}$ is determined by the attainment amount of the secondary electrons and the reflected electrons to the sample. Accordingly, this current can be controlled by forming a proper electric field over the sample.

Consequently, it is possible to reduce Q by optimizing a combination of the voltages applied to the holder 306 and the counter plate 304. When investigating the combination of the applied voltages, the following method is conceivable: Namely, the flow-in currents into the sample and a time change in the electrification amount onto the sample are estimated by making orbit calculations of the secondary electrons and the reflected electrons with the applied voltages used as the initial conditions. In many cases, however, various types of factors make it actually difficult to estimate the optimum combination of the applied voltages on the basis of the calculations alone.

In the present embodiment, there are provided the following method and a scanning electron microscope which includes a unit for implementing a method like this: Namely, in substitution for making the orbit calculations, the measurement is performed repeatedly with respect to samples of individual material properties under several electric-potential conditions. Then, the electric-potential condition for minimizing the electrification amount onto the sample is determined from the results obtained from the repeated measurements. Incidentally, the technique which will be explained hereinafter is exceedingly effective for a case where, like the photomask observation, the sample-constituting materials are standardized within the industries, and are limited to a small number of specific materials.

In particular, in accompaniment with the high-integration implementation and ultra-fine miniaturization of a semiconductor element in recent years, the accuracy of a measurement is severely requested. Simultaneously, the number of the measurement points, in some cases, is caused to attain to many thousands of points by the complication of the OPC pattern. It is conceivable that the magnification variation is caused to occur by the accumulation of microscopic electric charges during the execution of a SEM-based measurement or the like. The optical-condition setting method, which will be explained hereinafter, can be an exceedingly effective method for implementing the high-accuracy implementation of the measurement.

In the present embodiment, the explanation will be given below concerning the technique for solving the following technical problem: Namely, the magnification variation is caused to occur by the influence of the accumulation of the sample electrification mainly when the sample is observed using the scanning electron microscope.

As a to a resolution to the problem, the following technique is proposed: Namely, in order to reduce the electric charges accumulated onto the sample, from the result of an actual multi-points measurement, an optimum electric potential which becomes an electrification-neutralizing point of the sample electrification is determined, then being set into an evaluation device. Also, it is employed as one of its main features to switch the optimum electric-potential setting on each sample basis simply and easily.

According to the above-described technique, it becomes possible to suppress the accumulation of the sample electrification for each sample-constituting material, and to suppress the magnification variation in the multi-points measurement within a measurement-error range. This feature allows accomplishment of the high-accuracy multi-points measurement. This technique is exceedingly effective for the case where the observation targets are limited to a few types of samples whose constitution materials are known in advance.

Embodiment 1

Figure 1:
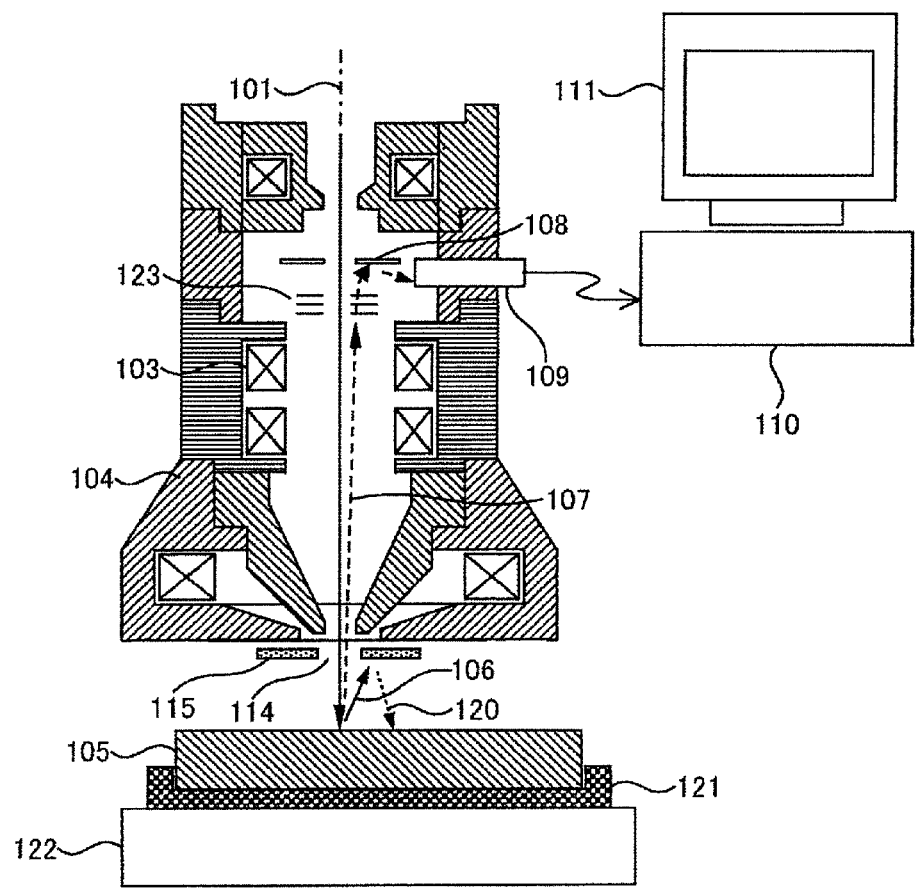
FIG. 1 is a schematic configuration diagram of a scanning electron microscope.

FIG. 1 is a schematic configuration diagram of a scanning electron microscope. A primary-electron beam 101 is emitted from an electron gun (which is omitted in the present diagram) deployed at an upward position in FIG. 1. Next, the primary-electron beam 101 is converged by a condenser lens 102, then being deflected by a deflection coil 103. After that, the primary-electron beam 101 is finally converged into an a-few-nm (: nanometers)-diameter electron beam by an objective lens 104, then entering the surface of a sample 105, i.e., an observation target. Moreover, some of the primary electrons that have entered the sample surface are reflected in the backward direction, thereby becoming reflected electrons 106 (i.e., back-scattered electrons). Also, some of the primary electrons generate secondary electrons 107 while being scattered inside the sample.

The secondary electrons 107 are pulled up in the upward direction by an electrostatic field which is formed between the sample 105 and the objective lens 104. Furthermore, the secondary electrons 107 collide with a conversion electrode 108, thereby generating new secondary electrons. These secondary electrons are grabbed into a detector 109. A photoelectron multiplier, which is built in the detector 109, generates a voltage in response to the amount of the secondary electrons. Accordingly, this voltage, after being processed by a signal processing device 110, is displayed as an image on an image display unit 111. The sample 105, which is loaded on a holder 121, is mounted on a precision stage 122. Consequently, in order to observe a desired location on the sample, the observation location can be positioned directly below the axis of the electron-optics system. It is possible to suppress the accumulation of the sample electrification in the multipoints measurement by optimizing a combination of the voltages applied to the holder 121 and a counter plate 115 (i.e., opposite electrode).

The device explained in the present embodiment includes a built-in power-supply for applying a positive or negative voltage to the opposite electrode 115, and applying a negative voltage (i.e., retarding voltage) to the holder 121 or the precision stage 122. The retarding voltage is applied thereto for decelerating the energy of the electron beam which will attain to the sample. In the present embodiment, the configuration is explained where the holder 121 is deployed on the precision stage 122. The present invention, however, is not limited thereto. For example, the configuration may be made holderless by providing a sample-holding device onto the precision stage 122. In the present patent specification, various types of sample-holding mechanisms are referred to as "sample base" in a lump.

Incidentally, a voltage or a current is applied or supplied to the electrodes and the coil by a not-illustrated control device. This control device is equipped with a calculation device. This calculation device controls the scanning electron microscope on the basis of an operation program therefor, which is referred to as "recipe". Also, the control device reads this recipe from a not-illustrated storage medium, thereby executing controls which will be described later. Also, the signal processing device 110 forms a profile waveform on the basis of the secondary electrons and the like emitted from the sample. Here, in this profile waveform, the longitudinal axis denotes the signal amount, and the transverse axis denotes a scanning position of the beam. Moreover, the signal processing device 110 so operates as to measure the pattern dimension by determining the distance between peaks of this profile waveform.

Figure 4:
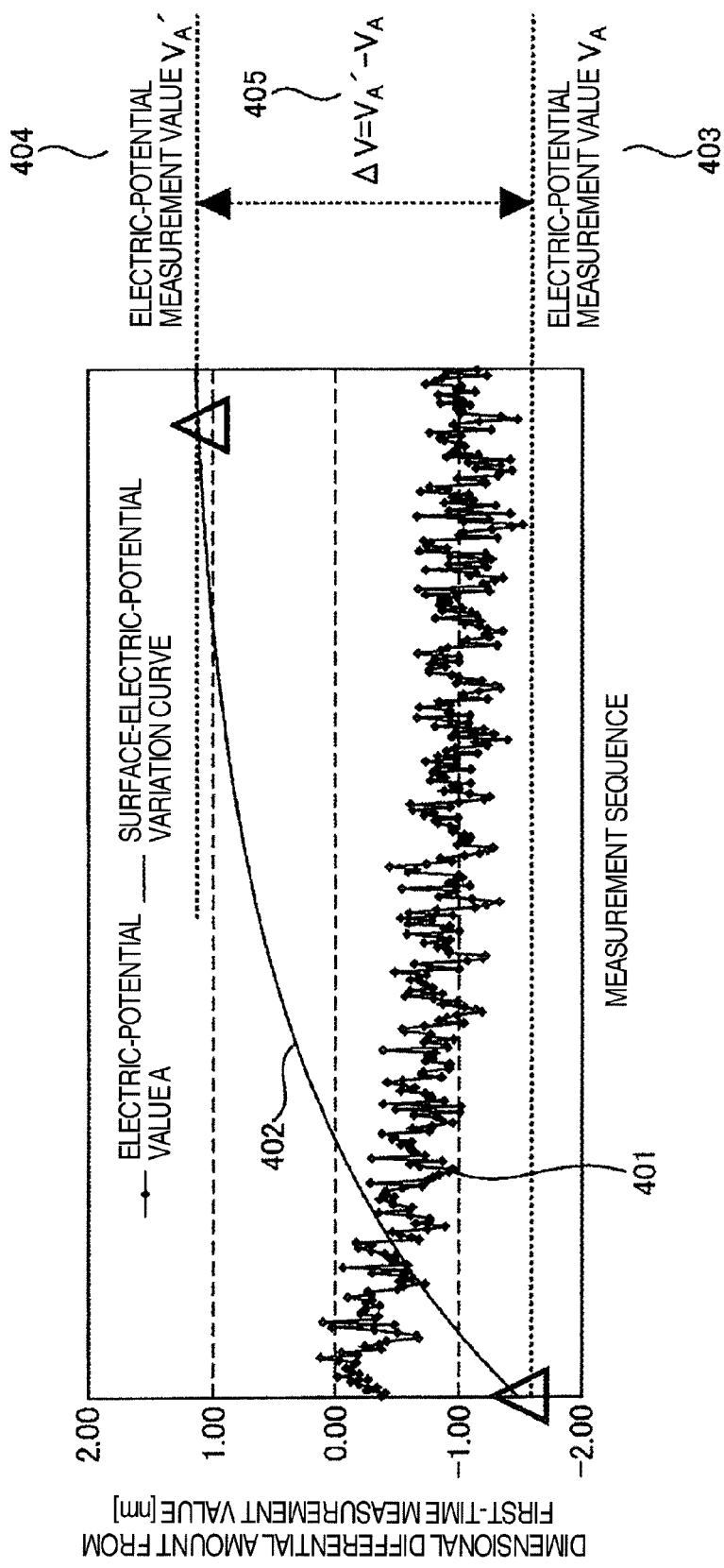
FIG. 4 is a diagram for illustrating an example of a dimension change which is caused to occur by the accumulation of the sample electrification in the multi-points measurement.

FIG. 4 is a diagram for illustrating an example of the result of repeated measurements of an identical point executed under a certain electric-potential condition A. In FIG. 4, the 2-μm-pitch patterns of identical line-and-space patterns, which are deployed at 20 locations uniformly within the sample surface, are sequentially measured. Moreover, this sequential measurement is repeated over 20 periods. The transverse axis in FIG. 4 denotes the number of the measurement points, and the longitudinal axis in FIG. 4 denotes differential values from the first-time measurement value. This example indicates a tendency that the dimension value 401 is going to decrease in accordance with the measurement sequence. This tendency is caused to emerge by the following phenomenon: Namely, the electric charges accumulated onto the sample change the sample-surface electric potential gradually, thereby exerting an influence on the orbit of the primary-electron beam. Then, as a result of this influence, the effective magnification of the scanning electron microscope is changed.

A reference numeral 402 in FIG. 4 denotes a curve which is obtained by calculating the variation in the sample-surface electric potential from the above-described measurement result. The sample-surface electric potential indicates a tendency that the electric potential rises comparatively rapidly in the former-half portion of the measurement, and becomes gently saturated in the latter-half portion thereof. At the saturation point, the electrification amount onto the sample does not change in time. Accordingly, it turns out that the three types of currents in the Expression (1) are in the state of equilibrium under the combination condition of the sample-surface electric potential and the counter-plate-set electric potential at the saturation point.

Figure 5:
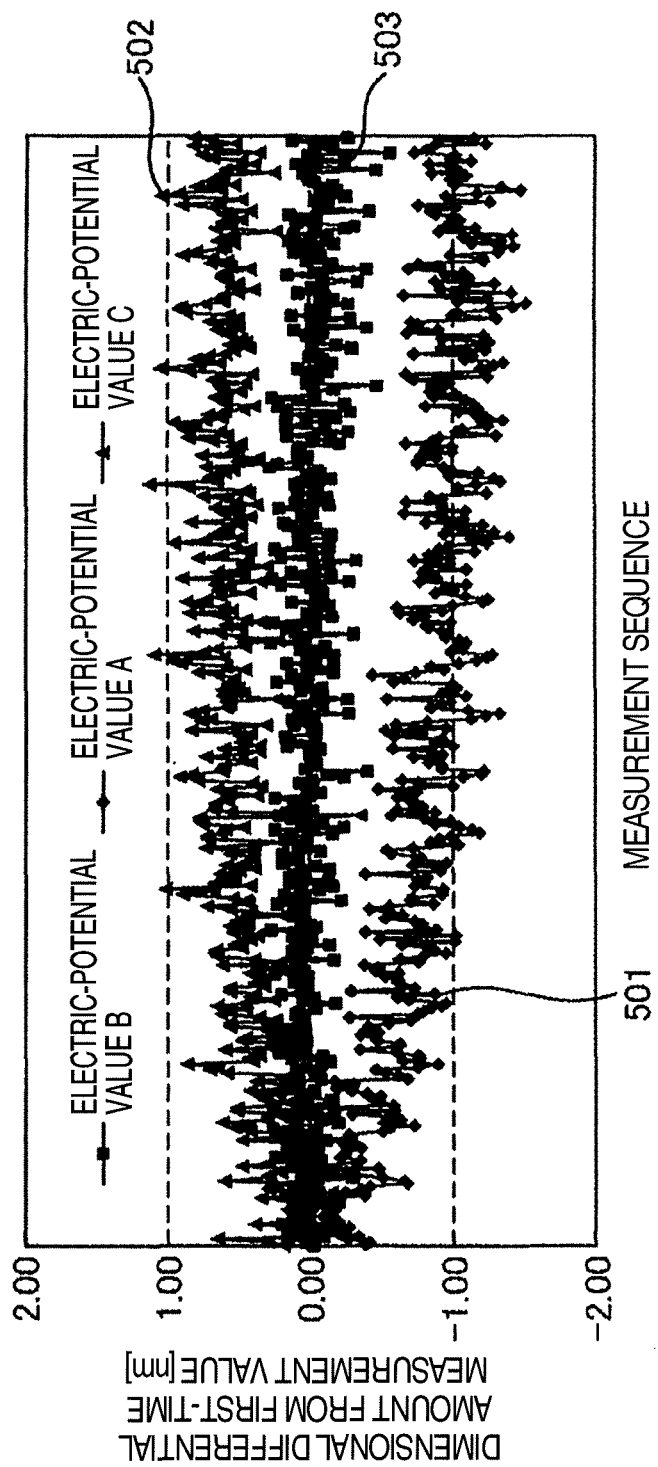
FIG. 5 is a diagram for explaining the transition of the dimension change which is observed when the multi-points measurement is performed under different surface electric-field conditions.

Consequently, the sample-surface electric potential at this time is tried to be recognized. This recognition makes it possible to suppress the magnification variation caused by the accumulation of the sample electrification. Taking this point-of-view into consideration, in the present embodiment, the following technique is proposed: Namely, FIG. 5 is a diagram for illustrating the result of execution of basically the same measurement as the one in FIG. 4 under set conditions A, B, and C. Here, in these set conditions A, B, and C, the combination conditions of the voltage applied to the counter plate 115 and the retarding voltage are made different from each other. The result 501 obtained from the set condition A indicates a tendency that the dimension value is going to decrease. In contrast thereto, the result 502 obtained from the set condition C indicates a tendency that, conversely, the dimension value is going to rise slightly. As is shown from this diagram, when compared with the results obtained from the other set conditions, the result 503 obtained from the set condition B indicates the occurrence of a smaller variation in the measurement result in accompaniment with the increase in the number of the measurement points. Accordingly, if the set condition A or C is the initial condition, these conditions are made closer to the set condition B. This operation makes it possible to suppress the magnification variation caused by the cumulative accumulation of the sample electrification even in the case of the multi-points measurement.

Each of the critical-dimension-value variation curves illustrated in FIG. 5 is subjected to a polynomial approximation using a linear straight line or a quadric curve, then calculating the coefficients of the polynomial approximation. In the case of the first-order approximation, the following method is effective: Namely, the transverse axis is divided into several sections. Moreover, in-section straight-line approximation expressions are determined, then determining an average value of the inclinations obtained. In the case of the second-order approximation, an average value of the obtained approximation expressions up to the saturation point (i.e., the value obtained by dividing the integration value up to the saturation point by the integration sections) is calculated.

Figure 6:
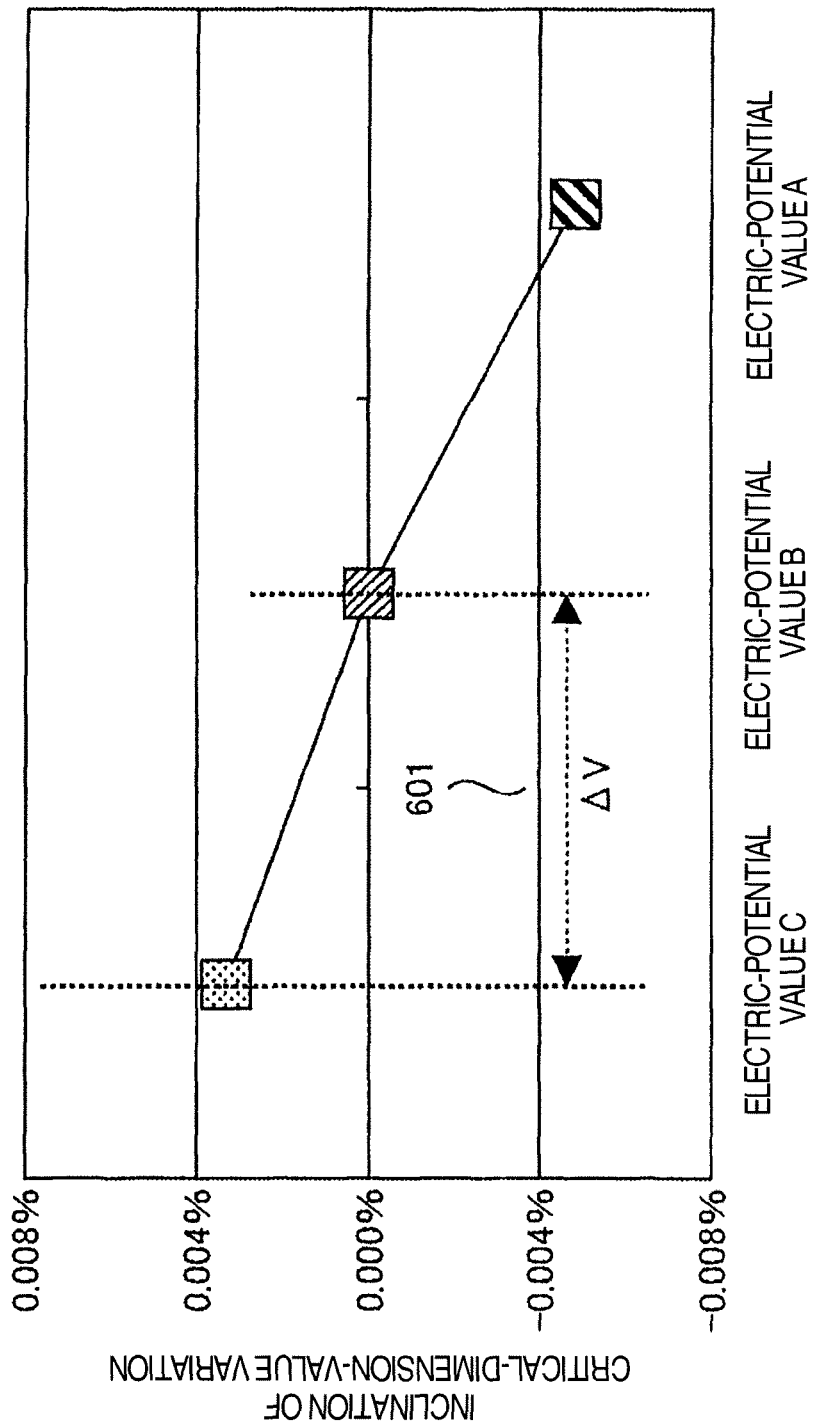
FIG. 6 is a diagram for explaining the relationship between the transition of a change in the critical-dimension value, which is observed when the multi-points measurement is performed under the different surface electric-field conditions, and the surface electric field.

FIG. 6 illustrates the correlation between the transition of the critical-dimension-value variation and the sample-surface electric potential in the case of the first-order approximation. The longitudinal axis denotes the inclinations of the approximation expressions. In the electric-potential condition B under which the zero-inclination point can be obtained, the time change in the sample-surface electric potential becomes its minimum. Accordingly, it is conceivable that, under this condition, the electrification amount onto the sample becomes equal to substantially zero. The result 503 illustrated in FIG. 5 is the result of the repeated measurements in the case where the electric-potential condition B is set. As is exactly expected, there exists no tendency of the dimension variation. More concretely, it has been found successful to suppress the repeated reproducibility of the measurements down to 0.6 nm or less, i.e., within 0.03% when converted to the magnification.

Incidentally, it is preferable to set the combination of the voltage applied to the opposite electrode and the retarding voltage so that the amount of the electrons entering the sample and the amount of the electrons emitted from the sample become equal to each other. Here, the relationship therebetween is determined by the sample-surface electric field. Accordingly, it is also preferable to select either of the opposite-electrode-applied voltage and the retarding voltage, or both of them as the adjustment target. If, however, the retarding voltage is changed, it turns out that the attainment energy of the electron beam which will attain to the sample is also changed. Consequently, when seen from a point-of-view of not permitting the attainment energy to be changed, it is advisable to selectively adjust the opposite electrode-applied voltage. Also, the opposite electrode may be of the flat-plate-like profile as exemplified in FIG. 1, or may be of a cylinder-like profile which will cover the electron-beam orbit.

Figure 8:
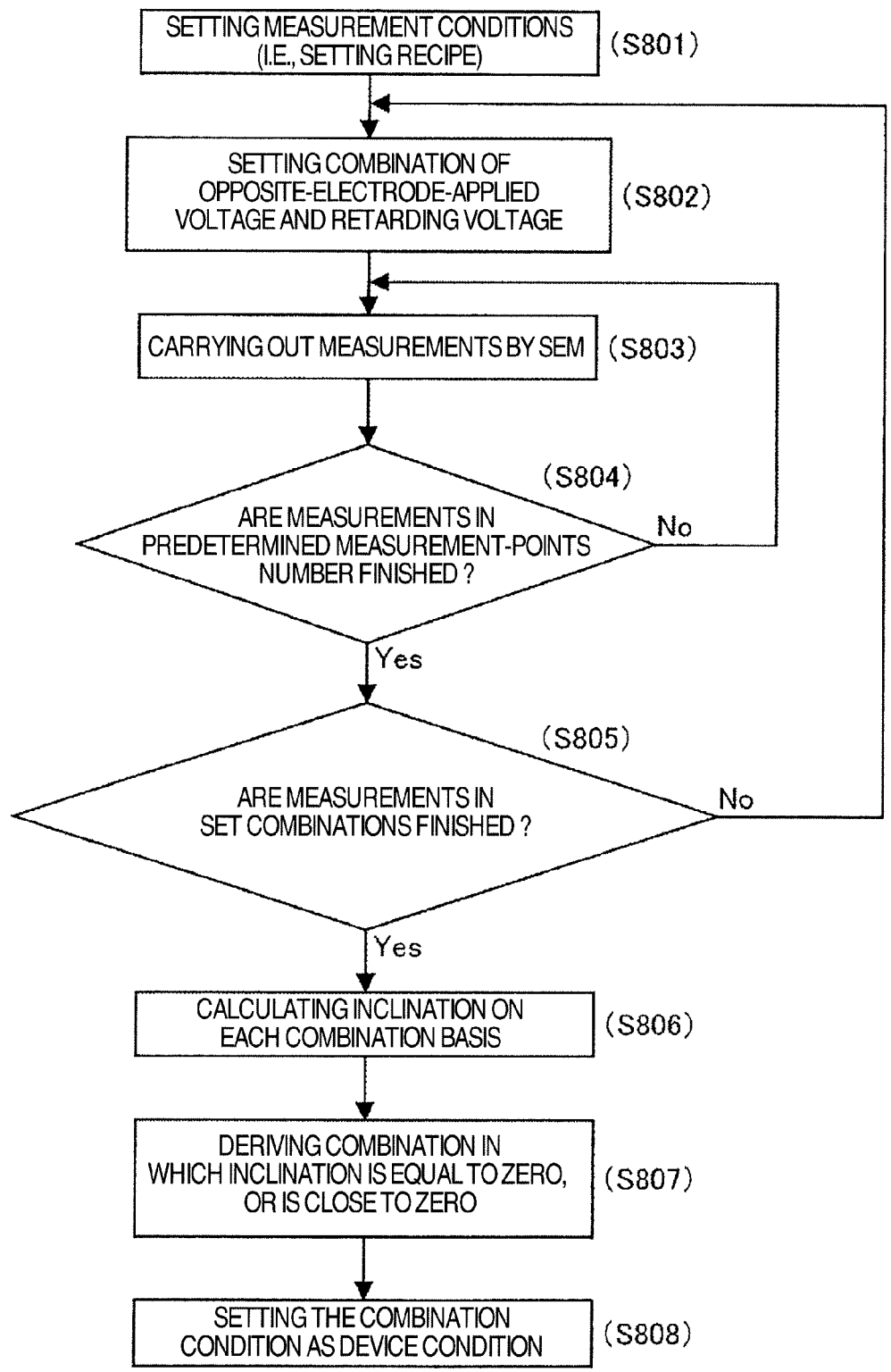
FIG. 8 is a flowchart for explaining steps of determining a device condition for the scanning electron microscope on the basis of the multi-points measurement.

FIG. 8 is a flowchart for indicating measurement processes for finding out the combination condition of the opposite-electrode-applied voltage and the retarding voltage. First, at a step 801, measurement conditions are set. Here, the measurement conditions are factors such as the number of combinations of the opposite-electrode-applied voltage and the retarding voltage, the applied voltages, the measurement-points number, the measurement positions, and the other optical conditions of the scanning electron microscope. The measurement positions are determined based on a spacing between the measurement points onto which the influence of the electrification will be cumulatively accumulated.

Next, at a step 802, based on the measurement conditions set at the step 801, the actual measurements are performed. Moreover, the measurements are performed with respect to a single combination of the opposite-electrode-applied voltage and the retarding voltage (step 804). Here, the measurements are performed in accordance with the same set conditions, and until the measurements by the amount of the measurement-points number have been finished. Furthermore, it is judged whether or not the measurements by the amount of the set combinations of the opposite electrode-applied voltage and the retarding voltage have been finished (step 805). Then, if it is judged that the measurements have been finished, the inclination exemplified in FIG. 5 is calculated on each combination basis (step 806). Incidentally, the calculation of the inclination may also be performed at a point-in-time when the measurement on each combination has been finished.

In addition, based on the plural pieces of inclination information and combination information, a graph as was exemplified in FIG. 6 is created. Then, a combination in which the inclination is equal to zero, or is close to zero is derived (S807). In this case, it is all right to determine an electric-potential value at the intersection point of the straight line (or curve) and the zero-inclination (i.e., an electric-potential difference between the retarding voltage and the opposite electrode-applied voltage). If, however, the device can set only a limited predetermined applied voltage, a settable electric-potential difference closest to the electric-potential value at the above-described intersection point may also be set as the device condition. Also, a predetermined threshold value is set in advance with the zero-inclination's electric-potential value set as its center. Then, an electric-potential difference corresponding to an inclination included within the threshold value may also be set as the device condition.

Figure 7:
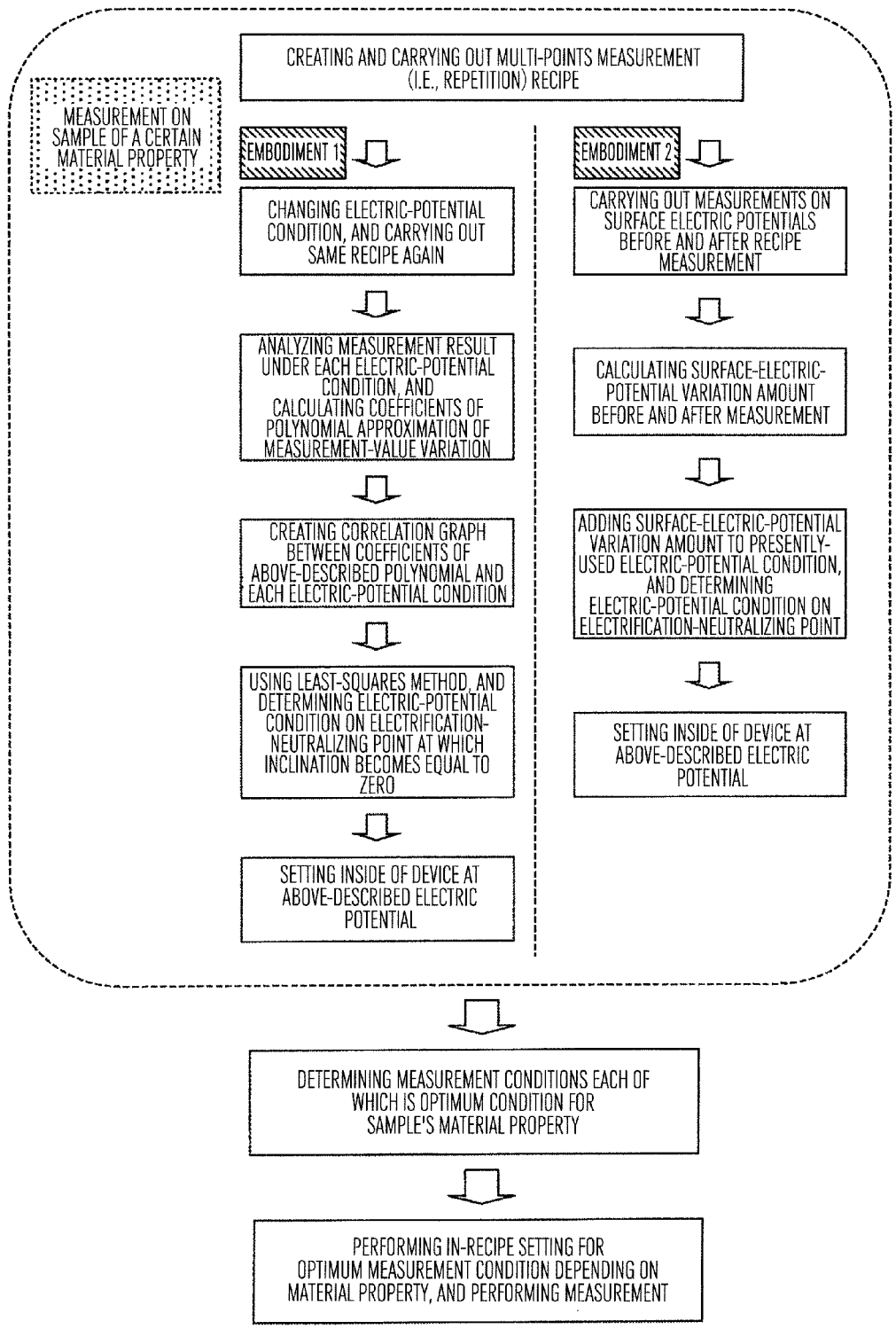
FIG. 7 is a flowchart for determining an electrification-neutralizing point in the multi-points measurement.

The combination condition determined as described above is set as the device condition (S808). For example, if the electric-potential value C illustrated in FIG. 6 is the initial device condition, the setting for the device condition is performed by adding and/or subtracting ΔV to and/or from the opposite-electrode-applied voltage and/or the retarding voltage. A flowchart illustrated in FIG. 7 is also a one for explaining steps for setting the device condition on the basis of the inclination information. The measurement conditions determined are stored in advance as recipes on each sample-species basis. When measuring the same sample, or a sample of the same material property, the corresponding measurement condition can be set by reading the corresponding recipe determined and created in advance.

Embodiment 2

In the state where the measurement value becomes saturated, the sample-surface electric potential is measured directly. This method also makes it possible to determine an electric potential at which the currents into the sample fall into a state of equilibrium. Concretely, when measuring the dimension as is the case with FIG. 4, the sample-surface electric potential is measured before the measurement is started and after the measurement value becomes saturated, respectively. Subsequently, a change value 405 in the sample-surface electric potential, i.e., $\Delta V = V_A' - V_A$, is calculated.

As a sample-surface electric-potential measurement technique, there exists a technique of creating an S curve by using an energy filter. The S curve is a curve for indicating the relationship between the electron amount obtained when the energy filter is set and swept and the applied voltage to the energy filter. The collection amount of the secondary electrons from the sample is recorded while running and pulling a voltage which is applied to a mesh electrode 123 deployed under the conversion electrode 108 in FIG. 1. The sample-surface electric potential can be estimated from the signal-amount change (i.e., the so-called S curve) in the secondary electrons relative to the applied voltage. A flowchart for explaining the technique of determining the opposite-electrode-applied voltage and the retarding voltage by actually measuring the sample-surface electric potential is also illustrated in FIG. 7 as is the case with the first embodiment.

In either of the above-described embodiments, the electric-potential condition on the optimized measurement can be registered into the in-device control device in advance. By calling for this optimized electric-potential condition when setting the measurement conditions, it also becomes possible to switch the electric-potential condition automatically.

Incidentally, in the above-described embodiments, the explanation has been given selecting the photomask as the example of the measurement target by the SEM. The present invention, however, is not limited thereto. Namely, if the electrification variation in the multi-points measurement is conspicuous, the embodiments can also be applied to the measurement-conditions setting for a semiconductor wafer.

REFERENCE SIGNS LIST

101 primary-electron beam
102 condenser lens
103 deflection coil 104 objective lens
105 sample
106 reflected electrons
107 secondary electrons
108 conversion electrode
109 detector
110 signal processing device
111 image display unit
115 counter plate

The invention claimed is:

1. A scanning electron microscope for measuring a pattern on a sample based on detection of electrons by scanning said sample surface with an electron beam, said scanning electron microscope comprising:
   a sample base to which a negative voltage is applied, said negative voltage being used for decelerating said electron beam which will attain to said sample;
   an opposite electrode for controlling an electric field which is generated on said sample; and
   a measurement device for:
      repeating measurements of dimensions at a plurality of measurement points on said sample, wherein an identical pattern is formed at each of said measurement points, and wherein said repeating is performed under each of a plurality of different electric-potential conditions between said sample base and said opposite electrode, and
   a calculation device for:
      determining a change over time of measurement values as a function of a number of completed measurements at said plurality of measurement points on said sample for each of said plurality of different electric-potential conditions, and
      based on said changes, calculating a voltage at which an inclination of said change of said measurement values under one of said plurality of different electric-potential conditions becomes equal to zero, or becomes close to zero,
      wherein said calculated voltage is applied to at least one of said sample base or said opposite electrode.

2. The scanning electron microscope according to claim 1, further comprising:
   an energy filter for making energy analysis of said electrons emitted from said sample,
   said calculation device carrying out measurement of a sample-surface electric potential before starting of said measurement on said sample, and carrying out said plurality of measurements, thereby calculating an electric-potential difference between said before-starting sample-surface electric potential and a sample-surface electric potential which is measured when a rise in said sample-surface electric potential becomes saturated.

3. The scanning electron microscope according to claim 1, wherein
   said calculation device sets said sample-base-applied voltage and/or said opposite electrode-applied voltage in dependence with material property of said sample.

4. A scanning-electron-microscope optical-condition setting method for measuring a pattern on a sample based on detection of electrons, by scanning said sample surface with an electron beam using a scanning electron microscope,
   said scanning-electron-microscope optical-condition setting method comprising the steps of:
   forming a plurality of different sample-surface electric fields on said sample surface;
   under each of said plurality of different sample-surface electric fields, repeating measurements of dimensions at a plurality of measurement points on said sample, wherein an identical pattern is formed at each of said measurement points;
   for each of said plurality of different sample-surface electric fields, determining a change over time of measurement values relative to as a function of a number of completed measurements at said plurality of measurement points on said sample; and
   based on said changes, controlling a sample-surface electric field so that an inclination of said change of said measurement values under said sample-surface electric field becomes equal to zero, or becomes close to zero.

* * * * *